US009647057B2

(12) United States Patent
Voiron (10) Patent No.: US 9,647,057 B2
(45) Date of Patent: May 9, 2017

(54) CAPACITOR 3D-CELL AND 3D-CAPACITOR STRUCTURE (71) Applicant: IPDIA, Caen (FR)

(72) Inventor: Frédéric Voiron, Barraux (FR)

(73) Assignee: IPDIA, Caen (FR)

(*) Notice: Subject to any disclaimer, the term of this patent is extended or adjusted under 35 U.S.C. 154(b) by 0 days.

(21) Appl. No.: 15/209,433

(22) Filed: Jul. 13, 2016

(65) Prior Publication Data

US 2017/0104057 A1 Apr. 13, 2017

(30) Foreign Application Priority Data

Oct. 8, 2015 (EP) .................................... 15189001

(51) Int. Cl.
H01L 49/02 (2006.01)
(52) U.S. Cl.
CPC .................................... H01L 28/87 (2013.01)
(58) Field of Classification Search
None
See application file for complete search history.

(56) References Cited

U.S. PATENT DOCUMENTS

| 5,021,920 A * | 6/1991 | Smith .............. H01L 27/10805 257/306 |
| 6,261,895 B1 | 7/2001 | Adkisson et al. |
| 8,283,750 B2 | 10/2012 | Guiraud et al. |
| 8,729,665 B2 | 5/2014 | Klootwijk et al. |
| 2012/0146182 A1 | 6/2012 | Oganesian et al. |
| 2015/0364538 A1* | 12/2015 | Wang ...................... H01L 28/65 257/534 |

FOREIGN PATENT DOCUMENTS

DE  10358299 A1  7/2005

OTHER PUBLICATIONS

Jatlaoui, M. M. et al., "New Ultra Low ESR Mosaic PICS Capacitors for Power Conversion," 10th European Microwave Integrated Circuits Conference (EuMIC), 4 pages, Sep. 7-8, 2015.

* cited by examiner

Primary Examiner — Michelle Mandala
(74) Attorney, Agent, or Firm — Seed IP Law Group LLP (57) ABSTRACT A capacitor 3D-cell formed on a silicon substrate is designed for producing low equivalent serial resistance and high capacitor surface-density. It combines a trench capacitor structure, multiple contact pads to at least one of the electrodes and a track which connects the electrode through the multiple contact pads so as to bypass said electrode between trench portions which are located apart from each other.

21 Claims, 8 Drawing Sheets

CAPACITOR 3D-CELL AND 3D-CAPACITOR STRUCTURE

TECHNICAL FIELD OF THE INVENTION

The invention relates to a capacitor structure, in particular for implementation within an integrated circuit. It relates in particular to 3D-capacitor arrangements, i.e. in which capacitor electrodes have electrode portions which extend perpendicular to the substrate surface.

BACKGROUND OF THE INVENTION

Devices with high capacitor surface-density and reduced spurious noise have been of major concern in the recent years for applications like power-supply decoupling. Indeed, many applications such as cellular phones, laptop computers, etc., are embedding multicore processors, with very high operation frequencies, that need embeddable and ultra-fast stepping power supplies, with variable and extremely stable output voltage, for example less than 5% output voltage ripple.

For such applications, surface-mounted components (SMC) are commonly used externally, and connected to a power supply grid at board level, thus providing increased capacitor surface-density.

However, the equivalent serial resistance (ESR) related to the surface-mounted components which are connected to the power supply grid might be significant, due to the long interconnection paths. The same also applies to the equivalent serial inductance, denoted ESL. Therefore, such design appears inadequate for efficient decoupling at high frequency, when high noise rejection is desired.

To overcome this issue, EP 2 145 351 proposes using an integration substrate designed for a system in package, with a through-substrate via and a trench capacitor where the trench is filled with capacitor electrode layers in an alternating arrangement with dielectric layers. The electrode layers are alternatingly connected to a respective one of two capacitor terminals which are provided on the first or second substrate side. The trench capacitor and the through-substrate via are formed in respective trench openings and via openings, in the semiconductor substrate, which have same lateral extent of more than 10 micrometers. This structure allows, among other advantages, a particularly cost-effective fabrication of the integration substrate, because the trench openings and the via openings in the substrate can be fabricated simultaneously.

U.S. Pat. No. 8,283,750 discloses a capacitor structure which is also based on a trench formed in a substrate, with the capacitor layer stack formed in the trench, but the trench is provided with a pillar which extends from the bottom of the trench up to the substrate surface. The capacitor layer stack also covers the sidewalls of the pillar, thereby increasing the capacitor surface-density, and improving the mechanical stability of the integrated circuit obtained. To this end, the pillar sidewalls comprise at least one score or protrusion which extends along the pillar height direction.

Such capacitor structures enable high capacitor surface-density, but they have high values for the equivalent serial resistance, which limits their electrical performances.

From this situation, the present invention aims at providing an alternative solution for decreasing the equivalent serial resistance of capacitor structures while maintaining high capacitor surface-density.

Another object of the invention is to provide capacitor structures which are both reliable and efficient for high-frequency applications, and which are also low-cost for manufacturing.

SUMMARY OF THE INVENTION

A first aspect of the invention provides a capacitor 3D-cell which is formed on a silicon substrate, wherein a trench extends within the substrate from a top face of this latter. The trench comprises at least first and second trench portions which are located on opposite lateral sides of an area of the substrate top face which is outside the trench, called not-etched area. The invention capacitor 3D-cell comprises:
  a first layer-shaped electrode which is disposed at least in both first and second trench portions, and forms at least one continuous first conduction path from the first trench portion to the second trench portion; and
  two dielectric-electrode (DE) structures which are stacked on the first electrode and each disposed at least in both first and second trench portions.

The first DE structure comprises at least one first electrically insulating layer which is disposed on the first electrode, and a second layer-shaped electrode which is disposed on the first electrically insulating layer. The second electrode further forms at least one continuous second conduction path from the first trench portion to the second trench portion.

The second DE structure comprises at least one second electrically insulating layer which is disposed on the second electrode, and a third layer-shaped electrode which is disposed on the second electrically insulating layer. The third electrode further forms at least one continuous third conduction path from the first trench portion to the second trench portion.

The invention capacitor 3D-cell further comprises:
  a first contact set which is arranged above the substrate top face for contacting the second electrode, this first contact set comprising at least two electrically conductive contact pads each in electrical contact with the second electrode but located out of and on either lateral side of the not-etched area, so that a first one of these contact pads is closer to the first trench portion compared to the second trench portion whereas the second contact pad is closer to the second trench portion compared to the first trench portion; and
  a first electrically conductive track which is arranged above the substrate top face and connects electrically the at least two contact pads of the first contact set to each other, so that the second conduction path between the first and second trench portions, as formed by the second electrode, is conductively bypassed for electricity flow by the first track through the first and second contact pads of the first contact set.

With such structure, and in particular thanks to the first electrically conductive track, the invention capacitor cell has a low value for the equivalent serial resistance. In addition, suitable design for the first electrically conductive track can also produce a low value for the equivalent serial inductance.

In preferred embodiments of the invention, the capacitor 3D-cell may further comprise:
  a second contact set which is also arranged above the substrate top face for contacting both the first and third electrodes, this second contact set comprising at least one first electrically conductive contact pad in electrical contact with the first electrode, and at least one second electrically conductive contact pad in electrical contact with the third electrode; and a second electrically conductive track which is arranged above the substrate top face and connects electrically the first and second electrically conductive contact pads of the second contact set to each other.

In this way, a first capacitor assembly which is formed by the first and second electrodes facing each other within the capacitor 3D-cell, and a second capacitor assembly formed by the second and third electrodes also facing each other within the capacitor 3D-cell, are connected in parallel. The invention capacitor 3D-cell thus exhibits a higher capacitor value, substantially equal to the sum of the respective capacitor values of the first and second capacitor assemblies. Possibly, the second contact set may comprise several second electrically conductive contact pads which are each in electrical contact with the third electrode, at respective locations which are distributed angularly about the not-etched area, in projection into the substrate top face. Then, the second electrically conductive track may connect these second electrically conductive contact pads so that a conduction path which is formed by the third electrode between any two locations of second electrically conductive contact pads, is conductively bypassed for electricity flow by the second track through the second contact pads of the second contact set. The second electrically conductive track arranged in this way participates in further reducing the value of the equivalent serial resistance of the capacitor 3D-cell. Also possibly, the third conduction path between the first and second trench portions, as formed by the third electrode, may be conductively bypassed for electricity flow by the second track through at least two second contact pads of the second contact set.

According to other optional improvements of the invention, the following additional features may be implemented:
- the first contact pad of the second contact set may be located above the not-etched area;
- the contact pads of the first contact set may be distributed angularly about the not-etched area, in projection into the substrate top face;
- the contact pads of the first contact set may be located radially beyond the trench from the not-etched area, in projection into the substrate top face; and
- the trench may have a design such as to form several pillars which are separated from each other and separated from sidewalls of the trench, and each pillar has side-surfaces which extend perpendicular to the substrate top face and to a bottom of the trench, and each one of the first electrode and the first and second DE structures cover the side-surfaces of the pillars. In particular, each pillar may be a tripod pillar.

When pillars are comprised in the trench design, and if the capacitor 3D-cell comprises a second contact set arranged above the substrate top face for contacting at least the third electrode, at least one electrically conductive contact pad which is in electrical contact with the third electrode may be located at least partially above one of the pillars, along a direction perpendicular to the substrate top face. Indeed, the pillar below the contact pad provides stability for this latter.

Generally for the invention, locating any contact pad out of the trench or above a pillar, namely anywhere out of an etched area within the substrate top face, allows the capacitor 3D-cell to be manufactured using integrated circuit technologies which do not require too much accurate mask alignment. Manufacturing costs can then be lower.

Again when pillars are comprised in the trench design, the not-etched area may be formed by at least one of the pillars.

Then, the capacitor 3D-cell may further comprise at least two additional areas which are located on opposite sides of the pillar-formed not-etched area, and which are separated from this pillar-formed not-etched area by a respective one of the trench portions. With such design, at least one contact pad of the first contact set may be located within each one of the additional areas. Preferably, each additional area may be outside the trench. Possibly, at least one contact pad to the first electrode may also be located within each one of the additional areas, in addition to the contact pad of the first contact set which connects the second electrode. Also preferably for further increasing the capacitor surface-density, the trench may have a design such as to form a plurality of pillars which are arranged according to a two-dimensional pattern outside the additional areas.

A second aspect of the invention provides a 3D-capacitor structure which comprises several capacitor 3D-cells formed on one same silicon substrate. All capacitor 3D-cells are each in accordance with the first invention aspect, and arranged close to one another on the substrate top face so as to form a tiling within at least one portion of this substrate top face. In the 3D-capacitor structure, the first electrode and each of the DE structures extend from any one of the capacitor 3D-cells to any other one of the capacitor 3D-cells, and the respective first electrically conductive tracks of the capacitor 3D-cells are connected to one another. Advantageously, the interconnected first electrically conductive tracks of the capacitor 3D-cells may form a first periodic 2D-network, namely a periodic two-dimensional network parallel to the substrate top face, above the tiling formed by the capacitor 3D-cells. Circuit design may be simplified in this manner, while further increasing the capacitor surface-density. Possibly, the first periodic 2D-network may be a grid of parallel lines or a square or rectangular array.

When the capacitor 3D-cells have second electrically conductive tracks for connecting the first electrode to the third one through respective contact pads, then the respective second electrically conductive tracks of the capacitor 3D-cells may be connected to one another. Advantageously, the interconnected second electrically conductive tracks of the capacitor 3D-cells may form a second periodic 2D-network above the tiling of the capacitor 3D-cells. Possibly, the second periodic 2D-network may also be a grid of parallel lines or a square or rectangular array.

Again when the capacitor 3D-cells have second electrically conductive tracks for connecting the first electrode to the third one through respective contact pads, at least some of the electrically conductive contact pads which contact a same one among the second and the third electrodes but belong to neighboring capacitor 3D-cells within the tiling, may be common to these neighboring capacitor 3D-cells.

Within the 3D-capacitor structure, each capacitor 3D-cell may have a trench design with pillars, with the first electrode and each DE structure covering the side-surfaces of the pillars. Then, at least one electrically conductive contact pad of the second contact set which is arranged for contacting at least the third electrode may be located at least partially above one of the pillars.

Finally, a third aspect of the invention provides an electronic device which comprises at least one 3D-capacitor structure, this latter being in accordance with the second invention aspect. Such electronic device may form a cellular phone, a tablet or a laptop computer.

Embodiments of the present invention are now illustrated by way of examples, and not limitedly, on the figures of the accompanying drawings, in which same reference signs refer to similar elements.

DETAILED DESCRIPTION OF INVENTION EMBODIMENTS

Figure 1:
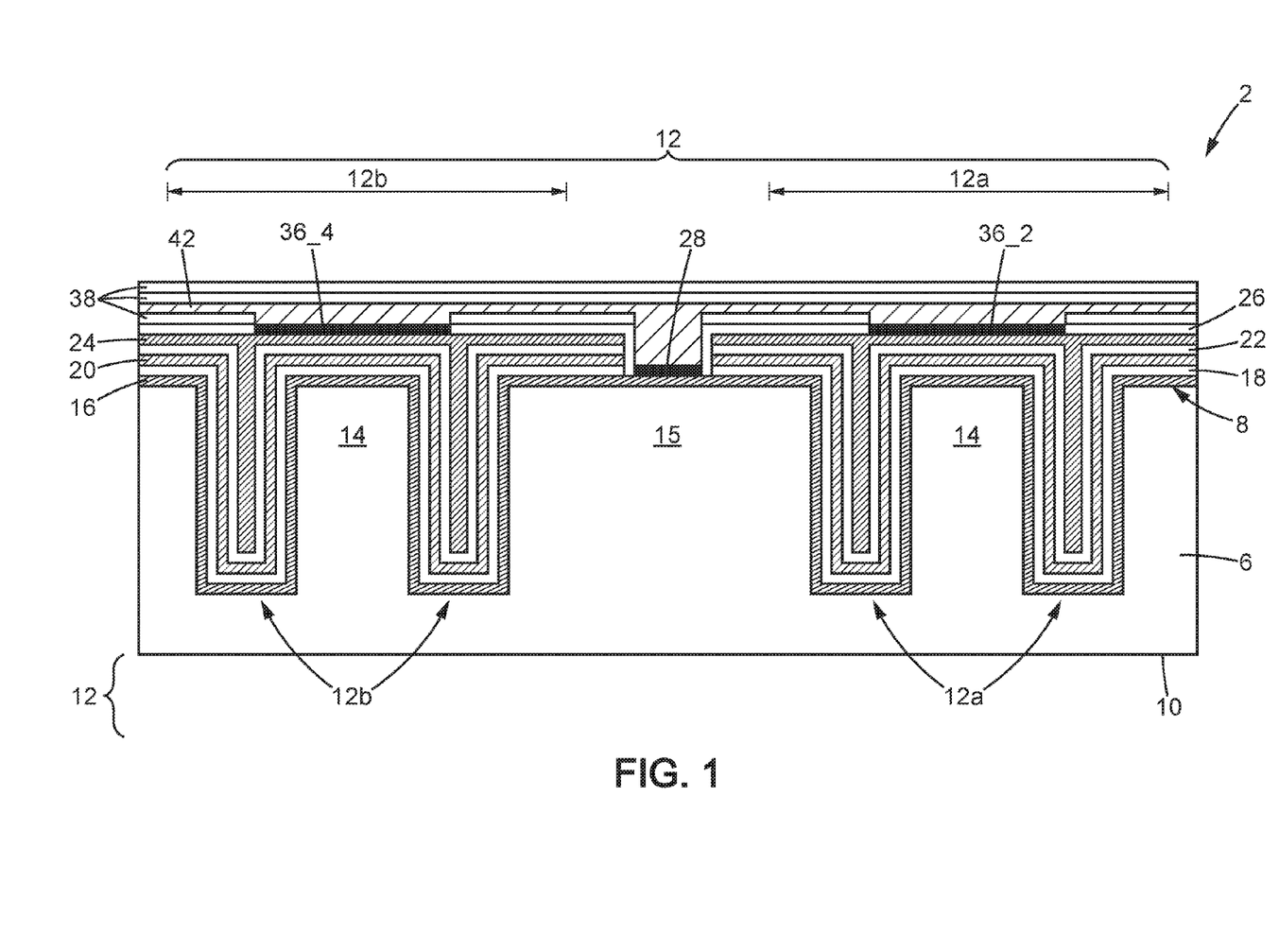
FIG. 1 is a schematic cross-sectional view of a capacitor 3D-cell according to one embodiment of the invention, and corresponding to the cutting line I-I indicated in FIG. 2.
Figure 5:
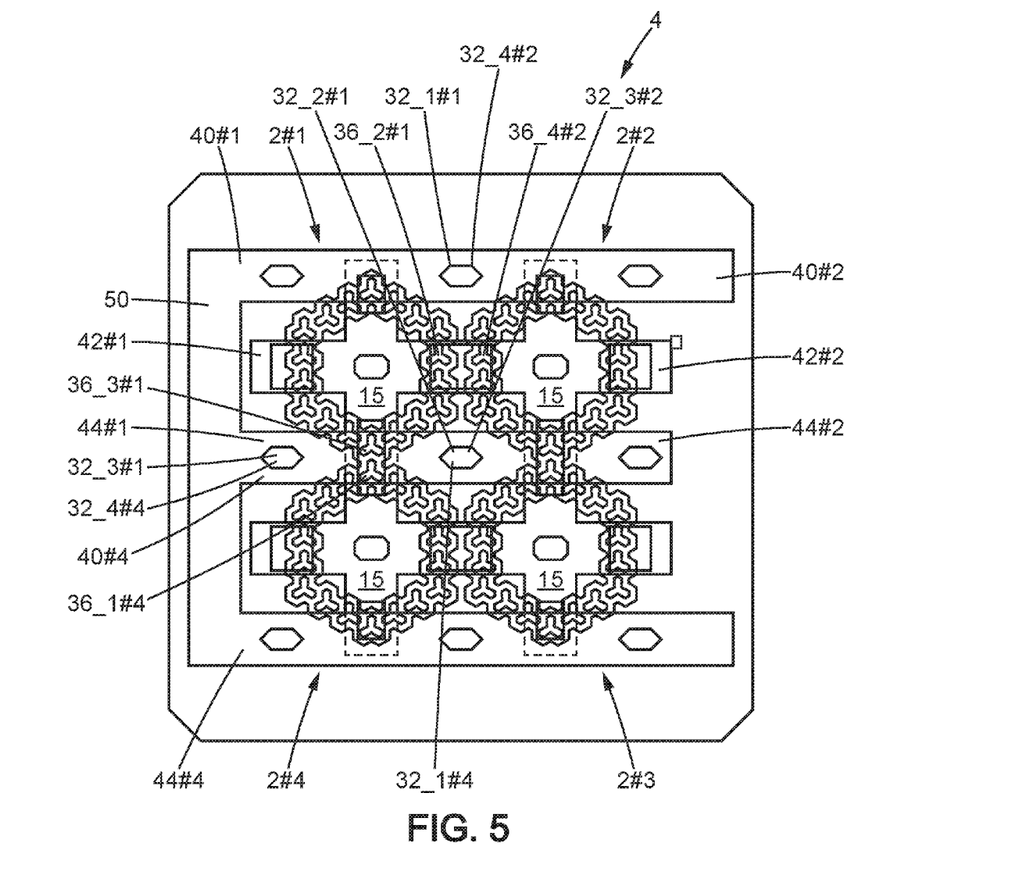
FIG. 5 is a schematic top view of a 3D-capacitor structure comprised of four capacitor 3D-cells each in accordance with FIGS. 1-3.

FIG. 1 shows a capacitor 3D-cell which is labelled 2 as a whole, and which may be used for forming a 3D-capacitor structure as shown in FIG. 5 and labelled 4. The capacitor structure implements a silicon substrate 6, with a top face 8 and a back face 10 which is opposite the top face 8. The thickness of the silicon substrate 6 may be adapted to adjust or increase a capacitor surface-density value of the capacitor 3D-cell 2. Part of the capacitor layers is realised in a trench 12 which is etched into the silicon substrate 6 from the top face 8. The silicon substrate 6 may be thinned down to approximately 100 µm (micrometer), but the minimum thickness of the silicon substrate 6 is determined by the depth of trench 12 which receives the capacitor layers. A crystal orientation of the silicon substrate 6 may also be selected to allow dry and/or wet etching with a desired etching direction. In the present description, the etching direction for the trench 12 is assumed to be perpendicular to the substrate top face 8.

Figure 2:
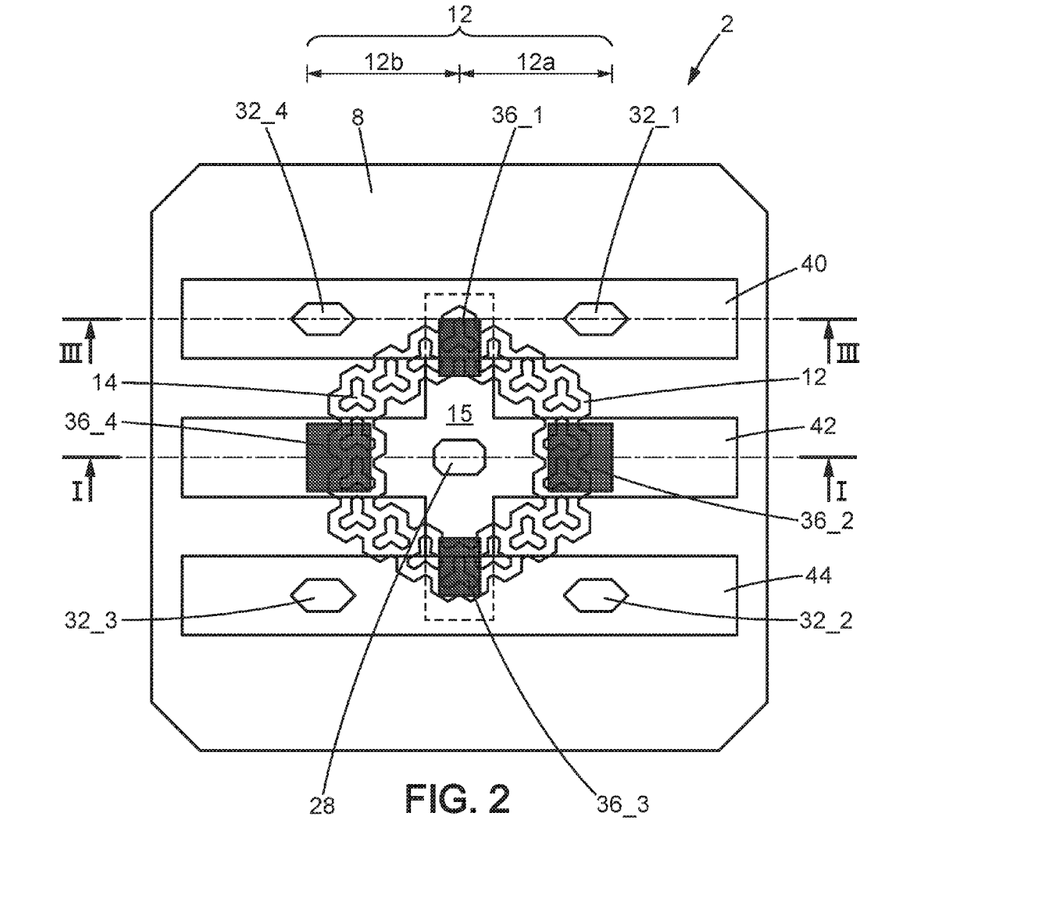
FIG. 2 is a schematic top view of the capacitor 3D-cell of FIG. 1.

The silicon substrate 6 is etched in a determined area for producing the trench 12. The trench 12 is realised by at least one etching step from the top face 8 of the silicon substrate 6. Wet etching or dry etching process may be used, or a combination of both. The width of the trench 12 may range from 1 µm to 3 µm, parallel to the top face 8, and its depth may range from 10 µm to 80 µm, perpendicular to the top face 8. Advantageously, the trench shape may be adapted to optimize layer deposition within the trench 12, and to increase the value of the capacitor surface-density. As shown on FIG. 1, the trench 12 is comprised of at least two trench portions 12a and 12b, one of them (12a) appearing in the right half-part of FIG. 1, and the other trench portion (12b) appearing in the left half-part of FIG. 1. In the exemplifying embodiment considered, each trench portion 12a, 12b appears in the cross-sectional view of FIG. 1 as two trench sections, because the trench design considered implements pillars 14 which are distributed within each trench portion. FIG. 2 shows a total number of eighteen pillars 14, each one with tripod shape as disclosed in U.S. Pat. No. 8,283,750. According to such shape, each pillar 14 has a height axis perpendicular to the substrate top face 8, and side-surfaces parallel to this axis, with three protrusions appearing in a pillar cross-section parallel to the substrate top face 8. All the pillars 14 are isolated in the trench 12, apart from one another and apart from sidewalls of the trench 12. In alternative embodiments, the tripod pillars 14 may be replaced in the capacitor 3D-cell 2 by meandering or rectangular pillars, or any other pillar shape. Advantageously, the trench 12 may be continuous around each pillar 14, and also may extend continuously from the trench portion 12a to the trench portion 12b. A not-etched area 15 exists between both trench portions 12a and 12b. The substrate top face 8 thus exists actually within the not-etched area 15. As an example, the overall peripheral outline of the trench 12 within the top face 8 may be a hexagon, but alternatively a square or any other shape, preferably a tiling pattern as this will be described later below. The not-etched area 15 is located around the centre point of the hexagon in the example considered.

The number of tripod pillars 14 and their arrangement in the silicon substrate 6 are determined by several parameters for controlling the equivalent serial resistance (ESR) of the capacitor 3D-cell 2. These parameters will be presented later in the description.

A first electrode 16 (FIG. 1) is deposited in the trench 12. It may be coupled electrically to the silicon substrate 6. It covers bottom and sidewalls of the trench 12, and also covers a determined area in the top face 8 of the silicon substrate 6, including the not-etched area 15. The first electrode 16 may be produced for example by dopant diffusion into the silicon substrate 6 from a doped glass layer which is first deposited at least in the trench 12 and over the not-etched area 15, and subsequently heated and then removed. It may alternatively be produced by deposition of a conductive layer, from a material such as nickel (Ni), titanium nitride (TiN), tungsten (W), titanium (Ti) or polysilicon (Poly). However, any other type of conductive layer can be used alternatively to manufacture the first electrode 16. The thickness of the conductive layer of the first electrode 16 may be selected so that the equivalent serial resistance of the capacitor 3D-cell 2 is controlled and minimum.

Figure 3:
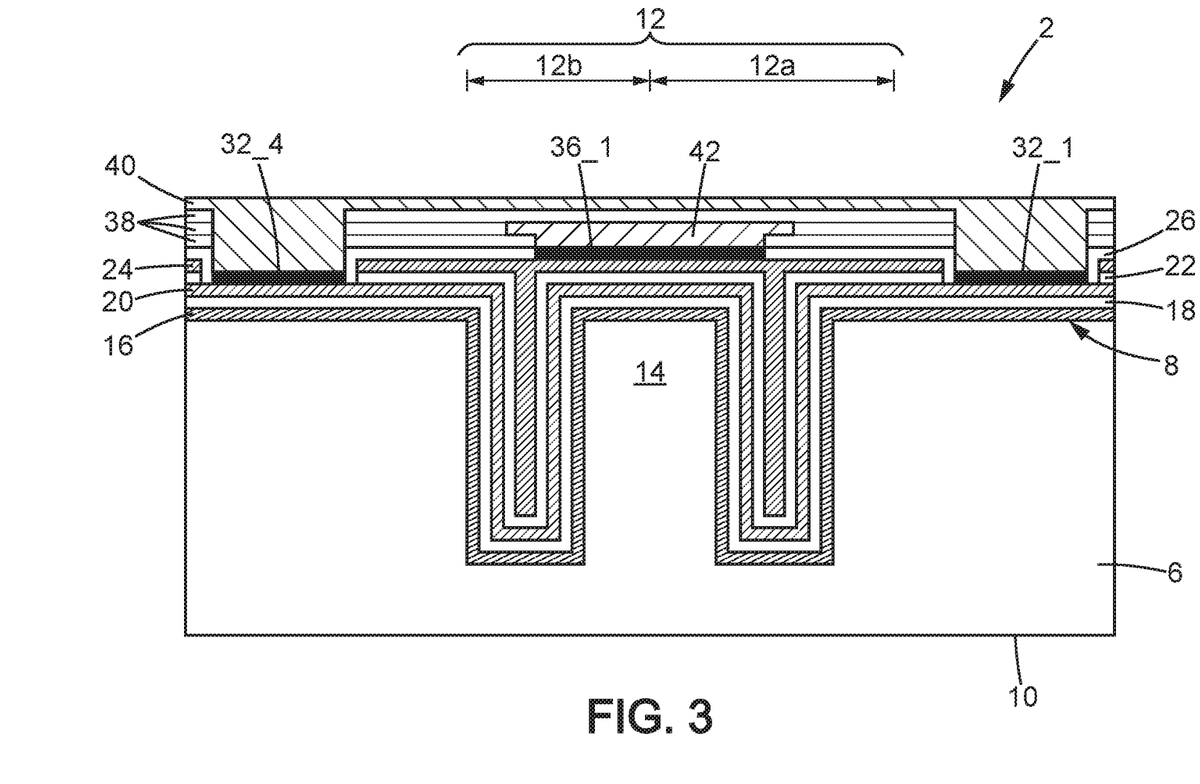
FIG. 3 is a schematic cross-sectional view corresponding to the cutting line III-III indicated in FIG. 2.

As this appears in FIGS. 1 and 3, two dielectric-electrode (DE) structures are deposited successively on the first electrode 16. Each DE structure comprises an electrically insulating layer and a conductive layer forming a further capacitor electrode. Thus, a first insulating—or dielectric—layer 18 is formed by the insulating layer of the first DE structure, and is deposited on the first electrode 16, including inside the trench 12. A second electrically conductive layer forms a second electrode 20, also belonging to the first DE structure.

The second DE structure comprises a second insulating—or dielectric—layer 22 formed on the second electrode 20, and a third electrode 24. All layers of each DE structure cover at least the bottom and the sidewalls of the trench 12, within the trench portions 12a and 12b. Such capacitor 3D-cell 2 is a MIMIM capacitor structure, or double MIM (metal-insulator-metal) capacitor structure. Further DE structures may be implemented as well, consequently to the second one. The number of DE structures to implement depends on the desired capacitor value and the desired value for the capacitor surface-density. But the number of DE structures may be preferably less than four, due to complex processing issues like stress and thermal budget which may become critical.

The first insulating layer 18 and the second insulating layer 22 may have same thickness, typically in the range from 0.02 µm to 0.2 µm. Each one of the first insulating layer 18 and second insulating layer 22 may be deposited for instance using a LPCVD (Low Pressure Chemical Vapor Deposition) process or an ALD (Atomic Layer Deposition) process, enabling depositing dielectric materials with high dielectric permittivity values (high K-value), and finely conformal with respect to the trench shape, even in case of high aspect ratio, defined as the ratio of the trench depth to the trench width. The insulating layers 18, 22 may be silicon dioxide ($SiO_2$) layers, or composite layers comprising a combination of silicon dioxide and silicon nitride ($Si_3N_4$), or a nano-laminated structure comprising materials with higher K-values like alumina ($Al_2O_3$), titanium dioxide ($TiO_2$), hafnium di-oxyde ($HfO_2$), or any dielectric material having a high breakdown field, like hydrogenated diamond-like carbon (DLC) layers, for example.

Thicknesses of the second electrode 20 and the third electrode 24 may be selected again to control the equivalent serial resistance of the capacitor 3D-cell 2. Polysilicon or refractory electrically conducting material such as titanium nitride (TiN) or tungsten (W) may be used for example.

An electrically insulating protection layer 26 (FIG. 1) may be deposited on the last DE structure, for avoiding that short-circuits between the electrodes be formed in the next steps of the manufacturing process. For instance, the protection layer 26 may be deposited across all the whole upper area of the capacitor 3D-cell 2.

In order to route electrical charge from or to the first electrode 16, a contact pad 28 is produced by deposition of an electrically conductive material inside an opening arranged through the DE structures. Preferably as shown on FIGS. 1 and 2, the contact pad 28 may be located above the not-etched area 15. Thus, it is easier to access to the first electrode 16. Advantageously, the contact pad 28 may have a polygon shape parallel to the top face 8, such as an octagonal shape for instance. Protection layer 26 may be produced so as to surround laterally the contact pad 28, thus avoiding electrical contact between the contact pad 28 and the second electrode 20 and third electrode 24. The contact pad 28 may be out of any one of the electrically conducting materials already cited.

Most often, the second electrode 20 is the most limiting element with respect to the equivalent serial resistance, because it is the thinnest electrode as compared with the first and third ones, and therefore more resistive. Typical resistance value for the second electrode 20 is about 10-20Ω/□ (Ohm per square), whereas the first electrode 16 and third electrode 24 have resistance values 30 to 50% lower than that of the second electrode 20. Therefore, the design of the electrical coupling to the second electrode 20 is critical for controlling and decreasing the equivalent serial resistance of the capacitor 3D-cell 2.

According to the invention, contacting the second electrode 20 is performed using a contact set which includes several contact pads. This contact set has been called first contact set in the general part of this description, and contains four contact pads labelled 32_1, 32_2, 32_3 and 32_4 respectively in FIGS. 2 and 3 (only the contact pads 32_1 and 32_4 appear in FIG. 3). Preferably, these contact pads to the second electrode 20 may be located outside the trench 12, and out of the not-etched area 15. Then, they may be located externally and radially away from the peripheral outer edge of the trench 12. The contact pads 32_1, 32_2, 32_3 and 32_4 may be produced in a manner similar to that used for contact pad 28. The protection layer 26 may be used again for insulating the contact pads 32_1, 32_2, 32_3 and 32_4 from the third electrode 24. Hence the contact pads 32_1, 32_2, 32_3 and 32_4 allow routing electrical charges to the second electrode 20. Each contact pad 32_1 to 32_4 may have a polygonal shape such as a hexagonal shape as shown on FIG. 2.

Typical value for the contact resistance onto second electrode 20 may be about 40 Ohm/μm$^2$, possibly down to 10 Ohm/μm$^2$ when implementing silicide for the contact pads 32_1 to 32_4. Assuming a minimum contact size in the range of 1 to 10 μm$^2$, one can estimate the contact resistance for each pad in the order of 40Ω to 1Ω, from worst to best case. The contribution of the contact resistance to the overall equivalent serial resistance should be reduced by 10% in a typical case, by 20% in the worst case. As a consequence, assuming a resistance Rc for one contact pad, and a targeted value ESRt for the equivalent serial resistance of the capacitor 3D-cell, a minimum number n of contact pads for the second electrode 20 can be calculated using the criterium: $(10 \cdot Rc)/ESRt \leq n$ (eq. 1).

Another contact set is further provided, for routing electrical charges to the third electrode 24. This further contact set may comprise again four contact pads, labelled 36_1, 36_2, 36_3 and 36_4 respectively. These contact pads 36_1 to 36_4 may be partially located above some of the tripod pillars 14 and the trench 12, as shown in FIGS. 1 and 2 (only the contact pads 36_2 and 36_4 appear in FIG. 1). Similar pad manufacturing process as already implemented may be used again. Each contact pad 36_1 to 36_4 may have a square or rectangular shape as shown on FIG. 2. In this way, the contact pads dedicated to each one of the electrodes 16, 20 and 24 can be identified easily. In a preferred embodiment, the contact pads 36_1 and 36_3 may have one same rectangular shape and are situated at two opposite locations with respect to the trench 12 and the not-etched area 15. Contact pads 36_2 and 36_4 may have another rectangular or square shape, and are also situated at two opposite locations with respect to the trench 12 and the not-etched area 15, between the contact pads 36_1 and 36_3. Contact pads 28 and 36_1 to 36_2 form the second contact set as introduced in the general part of the present description.

In order to decrease the equivalent serial resistance and to manage the capacitor surface-density value of the capacitor 3D-cell 2, a new connection set for connecting electrically the three electrodes 16, 20, 24 is proposed. To this end, an interlevel dielectric structure 38 is formed on the protection layer 26 and the contact pads 28, 32_1 to 32_4 and 36_1 to 36_4, above the substrate top face 8. This interlevel dielectric structure 38 is designed so as to produce electrically conducting tracks for connecting the contact pads just presented.

As shown in FIGS. 2 and 3, a first track 40 connects electrically the contact pads 32_1 and 32_4. Thus, the track 40 bypasses the second electrode 20 between the contact pads 32_1 and 32_4, the contact pad 32_1 being closer to the trench portion 12a than the trench portion 12b, and conversely for the contact pad 32_4. The track 40 being embedded within the interlevel dielectric structure 38, and produced according to any process dedicated to this latter, such as dual-Damascene, its resistance against electricity flow can be lower than that of the second electrode 20. The track 40 may be finger-shaped in projection onto the substrate top face 8. Contact pad 36_1 which connects the third electrode 24 is isolated from the track 40 thanks to separate superposed metallization levels within the interlevel dielectric structure 38 (see FIG. 3).

In a similar way, another first track 44 (FIG. 2) may connect electrically the contact pads 32_2 and 32_3, thus bypassing the second electrode 20 between the contact pads 32_2 and 32_3, the contact pad 32_2 being closer to the trench portion 12a than the trench portion 12b, and the contact pad 32_3 being closer to the trench portion 12b than the trench portion 12a. Contact pad 36_3 which connects the third electrode 24 is isolated from the track 44 thanks to the superposed levels within the interlevel dielectric structure 38. Both tracks 40 and 44 are to be connected electrically to each other through any additional connection arrangement not shown in FIGS. 1 to 3. For example an additional track finger (not shown) may connect contact pad 32_1 to contact pad 32_2, and still another track finger (not shown) may connect contact pad 32_3 to contact pad 32_4, at the same metallization level as the first tracks 40 and 44 within the interlevel dielectric structure 38.

A second track 42 (FIGS. 1 and 2) connects electrically the contact pads 28, 36_1, 36_2, 36_3 and 36_4. The track 42 produces the electrical parallel arrangement of the first electrode 16 and third electrode 24 with respect to the second electrode 20. In addition, the track 42 bypasses the third electrode 24 between any two contact pads among contact pads 36_1, 36_2, 36_3 and 36_4. Also because the track 42 is produced according to any process dedicated to the interlevel dielectric structure 38, its resistance against electricity flow can be lower than that of the third electrode 24. The track 42 is isolated electrically from the tracks 40 and 44, in particular in proximity of the contact pads 36_1 and 36_3. Such electrical isolation may be provided by the track 42 being contained in a metallization level which is lower than that of the tracks 40 and 44 within the interlevel dielectric structure 38, as this appears in FIG. 3.

The tracks 40, 42 and 44 may advantageously be out of a metal with low resistivity value, such as aluminium for example, or preferably thick aluminium with typical thickness in the range of 3.5 µm for a resistance value of less than 0.03Ω/□, or copper and also preferably thick copper with typical thickness in the range of 4.5 µm for a resistance value of less than 0.03 Ω/□.

Sizing of the tracks 40, 42, 44 is determined from the sizes of the contact pads. The size of each contact pads 36_1 to 36_4 may be set to the minimum size allowed in the integration technology used, for instance 10 µm² in the worst case, preferably 1 µm² and most preferably 2500 nm² for most advanced integration technologies.

Another advantage of this invention embodiment is that the contact pads 32_1 to 32_4 are corners of a peripheral limit of a complete capacitor-3D cell 2. The capacitor 3D-cell 2 thus includes a contact set which is dedicated to the second electrode 20, and another contact set which is dedicated to both first electrode 16 and third electrode 20. So it is possible and easy to arrange several capacitor 3D-cells close to one another on the substrate 6, in a tiling-wise manner at the top face 8.

Figure 4:
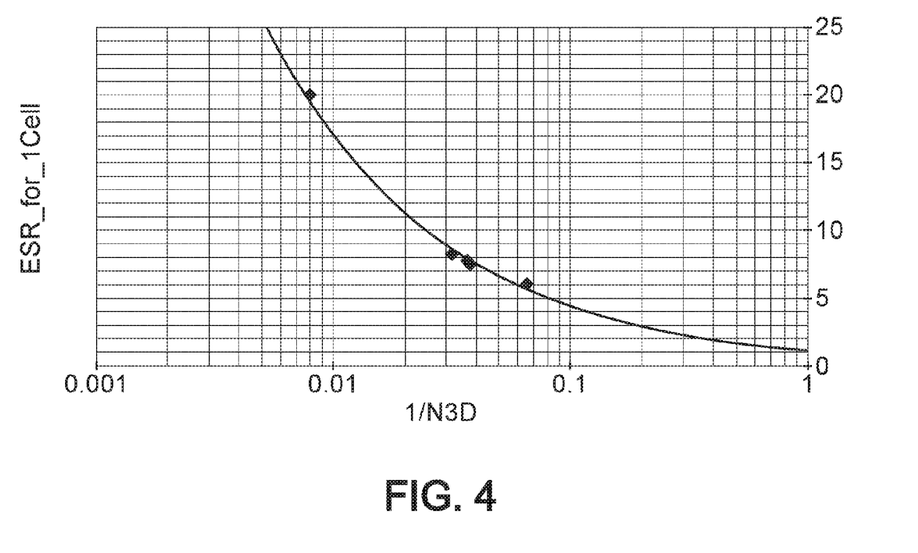
FIG. 4 displays variations of the ESR value of the capacitor 3D-cell of FIGS. 1-3, as a function of a surface-density involved with this capacitor 3D-cell.

The capacitor 3D-cell 2 presented just above comprises four contact pads 32_1 to 32_4 for the first contact set, coupled to the second electrode 20. The number n of contact pads 32_1, 32_2, . . . , 32_n within this first contact set may vary and be maximized for an area occupied by the capacitor 3D-cell 2. The number n of contact pads for the first contact set can be calculated using the following asymptotic equation: ESRt. n=a*[1/N3D]$^b$ (eq. 2), where a and b are constant positive numbers, and N3D is the number of tripod pillars. An example of such asymptotic equation is presented on FIG. 4, corresponding to the case of a capacitor 3D-cell which has only one contact pad (n=1) with varying numbers of tripod pillars 14. 1/N3D thus represents a surface-density of the capacitor 3D-cell.

The number n of contact pads to be inserted in each capacitor 3D-cell may be set to the minimum required to meet the ESRt requirement as per equation eq. 2, so that the density of the capacitor 3D-cell 2 is maximized. Indeed, since contact pads cannot be overlaid with one another above the capacitor 3D-cell, each addition of a further contact pad results in a reduction in the capacitor surface-density. As a consequence, although inserting a higher number of contact pads would further reduce the equivalent serial resistance, this is not preferred beyond a threshold since it also reduces the value of the capacitor surface-density.

A similar approach for designing and determining the number of contact pads may be applied for contacting the first or third electrode 16, 24, although these first and third electrodes 16, 24 contribute to the equivalent serial resistance (ESR) of the capacitor 3D-cell 2 in a lesser extent compared to the second electrode 20. Parameters a and b in the equation eq. 2 when relating to the first or third electrode 16, 24 may differ from the above description provided for the second electrode 20, and yield usually a lower number of contact pads as compared to the second electrode 20.

A similar approach may be used for any additional electrode when more than two DE structures are implemented. For each additional electrode, parameters a and b in equation eq. 2 differ from those related to any other electrode, and yield a different number of contact pads for each electrode.

FIG. 5 shows four capacitor 3D-cells formed on one same silicon substrate and adjoining each other. The four capacitor 3D-cells are processed simultaneously for manufacturing of the whole 3D-capacitor structure 4. The four capacitor 3D-cells are labelled 2#1, 2#2, 2#3 and 2#4, respectively. All same elements in the capacitor 3D-cells are labelled in the same way as in FIGS. 1-3 but completed after #-sign with the number of the corresponding capacitor 3D-cell.

For further increasing the capacitor surface-density which is effective for the whole 3D-capacitor structure 4, the contact pad 32_1#1 (corresponding to the contact pad 32_1 of the capacitor 3D-cell 2#1) may be combined with the contact pad 32_4#2 (corresponding to the contact pad 32_4 of the capacitor 3D-cell 2#2). Likewise, the contact pad 32_2#1 (corresponding to the contact pad 32_2 of the capacitor 3D-cell 2#1) may be combined with the contact pad 32_3#2 (corresponding to the contact pad 32_3 of the capacitor 3D-cell 2#2). The same may be applied for the contact pads 36_2#1 (corresponding to the contact pad 36_2 of the capacitor 3D-cell 2#1) and 36_4#2 (corresponding to the contact pad 36_4 of the capacitor 3D-cell 2#2). Etc. The tracks 40#1, 42#1 and 44#1 of the capacitor 3D-cell 2#1 extend continuously with the tracks 40#2, 42#2 and 44#2 of the capacitor 3D-cell 2#2.

Similar combinations are produced for the 3D-cell capacitors 2#1 and 2#4: contact pad 32_2#1 is also combined with contact pad 32_1#4, contact pad 32_3#1 is combined with contact pad 32_4#4, contact pad 36_3#1 is combined with contact pad 36_1#4, etc, and track 44#1 is combined with track 40#4.

Same principles also apply for capacitor 3D-cells 2#2 and 2#3, and also for capacitor 3D-cells 2#4 and 2#3.

An additional track 50, also called common line, may connect the first tracks 40#1, 44#1, 40#4 and 44#4. The common line 50 may have the maximum width allowed by the minimum spacing Ms between adjacent tracks. This distance depends on the metal thickness T, and is typically in the range of 0.5×T<Ms<2×T. With this configuration, the resistance of the tracks is lower by several orders of magnitude, typically 100 to 1000, compared to the resistance of the second electrode 20, and thus contributes to further decrease the equivalent serial resistance of the 3D-capacitor structure.

Although the common line 50 is located away from the contact pads to the second electrode 20 in FIG. 5, it may alternatively be located above the contact pads 32_1#1 and 32_2#1 for connecting them to each other within the capacitor 3D-cell 2#1, and also for contacting in a similar way the contact pads to the second electrode 20 which belong to the other capacitor 3D-cells, in addition to the first tracks. A set of common lines may thus be involved, parallel to each other and perpendicular to the first tracks.

Figure 6:
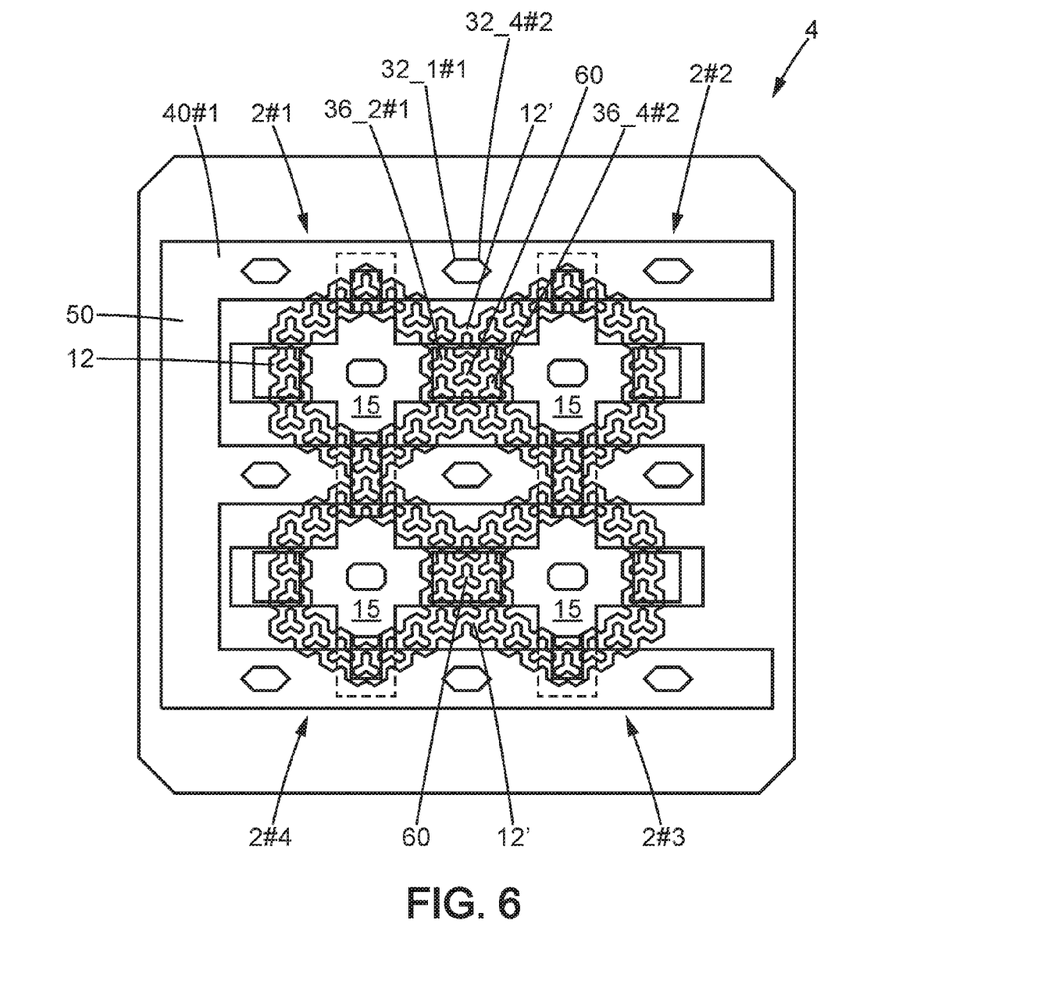
FIG. 6 is a schematic top view of an improved embodiment of the 3D-capacitor structure of FIG. 5.

In order to further increase the capacitor surface-density of the 3D-capacitor structure 4 as shown in FIG. 5, it is proposed to fill the space between two neighbouring capacitor 3D-cells 2. Thus, as shown in FIG. 6, a trench portion 12' is etched and forms additional tripod pillars 60 between the capacitor 3D-cells 2#1 and 2#2, and also between the capacitor 3D-cells 2#3 and 2#4. The trench portion 12' connects the trenches 12 of two neighbouring capacitor 3D-cells, and the tripod pillars 60 are intercalated between the tripod pillars 14 of these two neighbouring capacitor 3D-cells 2. The tripod pillars 60 may be similar to the tripod pillars 14, and the trench portion 12' may have same width and same depth than the trenches 12. Furthermore, the tripod pillars 60 and the trench portion 12' are coated by the same layer sequence as the tripod pillars 14 and the trenches 12. The number of tripod pillars 60 and their position between two adjacent capacitor 3D-cells may depend on the space available between two neighbouring capacitor 3D-cells.

The total number of capacitor 3D-cells to be adjoined and combined in a manner similar to those shown in FIGS. 5 and 6, may be any, for example an array of M×N capacitor 3D-cells, M and N each being any integer higher than or equal to two. Then, the first tracks connecting the second electrode from all the capacitor 3D-cells may form a grid of parallel lines, or a square or rectangular array depending on the location of the common line(s). The second tracks connecting the first and third electrodes from all the capacitor 3D-cells form an array with square pattern. Such 3D-capacitor structure is easy to manufacture whatever its cell number. It exhibits a high capacitor surface-density value and a low value for the equivalent serial resistance, as well as a low value for the equivalent serial inductance.

Figure 7:
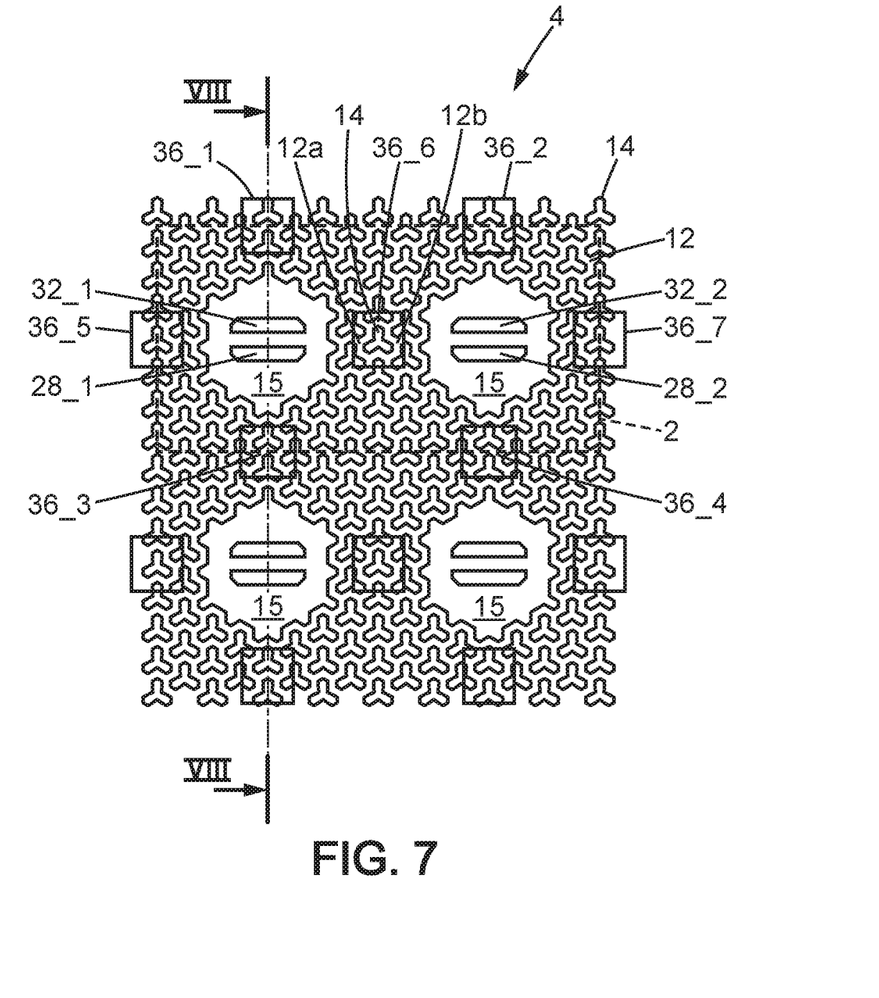
FIG. 7 is a schematic top view of another 3D-capacitor structure according to the invention.

In the other embodiment illustrated by FIG. 7, the capacitor 3D-cell 2 is indicated by a frame in broken line, and the complete 3D-capacitor structure 4 is obtained by repeating the capacitor 3D-cell 2 at the top face of the silicon substrate, and arranging all the capacitor 3D-cells close to one another. Each capacitor 3D-cell may comprise a two-dimensional array of tripod pillars except in two areas which are labeled 15, each tripod pillar being such as described above. The areas 15, which may be not-etched areas, are separated from each other by at least one tripod pillar labeled 14 in FIG. 7 and by the trench portions 12a and 12b. In this embodiment, trench portion 12a is between tripod pillar 14 and the area 15 located in the left half-part of the capacitor 3D-cell 2, and trench portion 12b is between tripod pillar 14 and the area 15 located in the right half-part of the capacitor 3D-cell 2. Thus, the tripod pillar labeled 14 in FIG. 7 forms the not-etched area of the general part of this description, and the areas 15 form to the additional areas.

The layer stack for forming the capacitor structure may be similar to that used in the embodiment of FIGS. 1 to 3, including layers 16, 18, 20, 22, 24, 26 and the interlevel dielectric structure 38.

A contact pad 32_1 to the second electrode 20 may be located in the area 15 of the left half-part of the capacitor 3D-cell 2, and another contact pad 32_2 also to the second electrode 20 may be located in the area 15 of the right half-part of the capacitor 3D-cell 2. Thus the contact pad 32_1 is closer to the trench portion 12a with respect to the trench portion 12b, and conversely for the contact pad 32_2.

Possibly, contact pads to the first electrode 16 may also be located in the areas 15: contact pad 28_1 in the area 15 of the left half-part of the capacitor 3D-cell 2, and contact pad 28_2 in the area 15 of the right half-part of the capacitor 3D-cell 2. Contact pads to the third electrode 24 are labeled 36_1 to 36_7 in FIG. 7, and may be located above some of the tripod pillars as already described with reference to FIGS. 1-3.

Figure 8:
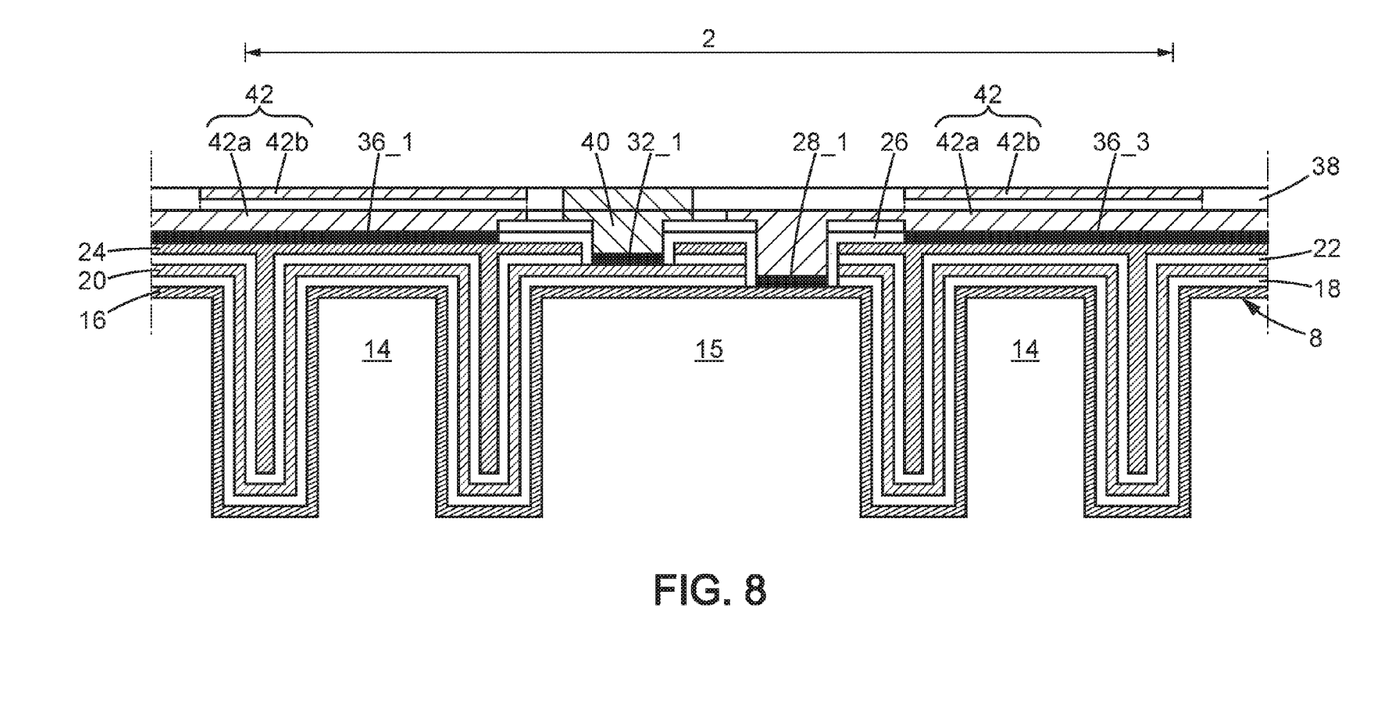
FIG. 8 is a schematic cross-sectional view corresponding to the cutting line VIII-VIII indicated in FIG. 7.

FIG. 8 is a cross-sectional view of the capacitor 3D-cell 2 along the cutting line VIII-VIII. It shows the capacitor-forming layer stack, the contact pad 28_1 to the first electrode 16, the contact pad 32_1 to the second electrode 20, and the contact pads 36_1 and 36_3 to the third electrode 24. It also shows a track 40 which connects electrically the contact pads 32_1 and 32_2 to each other, and to other contact pads to the second electrode 20 but belonging to other capacitor 3D-cells. The track 42 may be comprised of two parts 42a and 42b which are contained in separate metallization levels within the interlevel dielectric structure 38. Track part 42a may be lower in metallization level than track part 42b. Track part 42a connects electrically the contact pads 28_1 and 36_3 to each other for each area 15, and track part 42b connects electrically the track parts 42a which relate to different areas 15. Electrical connections between the track parts 42a and 42b may be out of the cross-section plane of FIG. 8, so they are indicated in thin broken lines perpendicular to the substrate top face 8. For example, such connections between the track parts 42a and 42b may be located at the corners of the capacitor 3D-cell 2 and around the center of the length sides of this capacitor 3D-cell 2. Once again, the tracks 40 may form a grid of parallel lines or a square or rectangular array above the substrate top face 8, and above the tiling formed by the capacitor 3D-cells. The same also applies to the tracks 42.

While the invention has been illustrated and described in details above, such illustrations and descriptions have to be considered as illustrative or exemplary but not restrictive. The invention is not limited to the disclosed embodiments. Variations from these disclosed embodiments can be understood and effected by those skilled in the art of integrated circuit design without involving any inventive step.

The invention claimed is:

1. A capacitor 3D-cell formed on a silicon substrate, wherein a trench extends within the substrate from a top face of said substrate, the trench comprising at least first and second trench portions which are located on opposite lateral sides of an area of the substrate top face which is outside the trench, called not-etched area, the capacitor 3D-cell comprising:
  a first layer-shaped electrode disposed at least in both first and second trench portions, and forming at least one continuous first conduction path from said first trench portion to said second trench portion;
  a first and second dielectric-electrode (DE) structures stacked on the first layer-shaped electrode and each disposed at least in both first and second trench portions,
    the first dielectric-electrode (DE) structure comprising at least one first electrically insulating layer disposed on the first layer-shaped electrode, and a second layer-shaped electrode disposed on the first electrically insulating layer, said second layer-shaped electrode forming at least one continuous second conduction path from said first trench portion to said second trench portion, the second dielectric-electrode (DE) structure comprising at least one second electrically insulating layer disposed on the second layer-shaped electrode, and a third layer-shaped electrode disposed on the second electrically insulating layer, said third layer-shaped electrode forming at least one continuous third conduction path from said first trench portion to said second trench portion;

a first contact set arranged above the substrate top face for contacting the second layer-shaped electrode, said first contact set comprising at least two electrically conductive contact pads each in electrical contact with said second layer-shaped electrode but located out of and on either lateral side of the not-etched area, so that a first one of said contact pads is closer to the first trench portion compared to the second trench portion whereas the second contact pad is closer to said second trench portion compared to said first trench portion; and a first electrically conductive track arranged above the substrate top face and connecting electrically said at least two contact pads of the first contact set to each other, so that the second conduction path between the first and second trench portions, as formed by the second layer-shaped electrode, is conductively bypassed for electricity flow by the first track through the first and second contact pads of the first contact set.

2. The capacitor 3D-cell according to claim 1, further comprising:

a second contact set arranged above the substrate top face for contacting both the first and third electrodes, said second contact set comprising at least one first electrically conductive contact pad in electrical contact with said first electrode, and at least one second electrically conductive contact pad in electrical contact with said third electrode; and a second electrically conductive track arranged above the substrate top face and connecting electrically said first and second electrically conductive contact pads of the second contact set to each other.

3. The capacitor 3D-cell according to claim 2, wherein the second contact set comprises several second electrically conductive contact pads which are each in electrical contact with the third electrode, at respective locations which are distributed angularly about the not-etched area, in projection into the substrate top face, and wherein the second electrically conductive track connects said second electrically conductive contact pads so that a conduction path formed by the third electrode between any two locations of second electrically conductive contact pads, is conductively bypassed for electricity flow by the second track through said second contact pads of the second contact set.

4. The capacitor 3D-cell according to claim 3, wherein the third conduction path between the first and second trench portions, as formed by the third electrode, is conductively bypassed for electricity flow by the second track through at least two second contact pads of the second contact set.

5. The capacitor 3D-cell according to claim 1, wherein the contact pads of the first contact set are distributed angularly about the not-etched area, in projection into the substrate top face.

6. The capacitor 3D-cell according to claim 5, wherein the contact pads of the first contact set are located radially beyond the trench from the not-etched area, in projection into the substrate top face.

7. The capacitor 3D-cell according to claim 1, wherein the trench has a design to form several pillars separated from each other and separated from sidewalls of the trench, and each pillar having side-surfaces extending perpendicular to the substrate top face and to a bottom of the trench, and wherein each one of the first electrode and the first and second DE structures cover the side-surfaces of the pillars.

8. The capacitor 3D-cell according to claim 7, wherein each pillar is a tripod pillar.

9. The capacitor 3D-cell according to claim 7, further comprising a second contact set arranged above the substrate top face for contacting at least the third electrode, said second contact set comprising at least one electrically conductive contact pad which is in electrical contact with said third electrode, and which is located at least partially above one of the pillars, along a direction perpendicular to the substrate top face.

10. The capacitor 3D-cell according to claim 7, wherein the not-etched area is formed by at least one pillar, and said capacitor 3D-cell further comprises at least two additional areas which are located on opposite sides of the pillar-formed not-etched area, and separated from said pillar-formed not-etched area by a respective one of the trench portions, and wherein at least one contact pad of the first contact set is located within each one of said additional areas.

11. The capacitor 3D-cell according to claim 10, wherein each additional area is outside the trench.

12. The capacitor 3D-cell according to claim 10, wherein at least one contact pad to the first electrode is also located within each one of the additional areas.

13. The capacitor 3D-cell according to claim 10, wherein the trench has a design to form a plurality of pillars which are arranged according to a two-dimensional pattern outside the additional areas.

14. A 3D-capacitor structure comprising several capacitor 3D-cells formed on one same silicon substrate, all capacitor 3D-cells being each in accordance with claim 1, and arranged close to one another on the substrate top face so as to form a tiling within at least one portion of said substrate top face, wherein the first electrode and each one of the DE structures extend from any one of the capacitor 3D-cells to any other one of the capacitor 3D-cells, and wherein the respective first electrically conductive tracks of the capacitor 3D-cells are connected to one another.

15. The 3D-capacitor structure according to claim 14, wherein the interconnected first electrically conductive tracks of the capacitor 3D-cells form a first periodic 2D-network above the tiling formed by the capacitor 3D-cells.

16. The 3D-capacitor structure according to claim 14, wherein each capacitor 3D-cell includes:

a second contact set arranged above the substrate top face for contacting both the first and third layer-shaped electrodes, said second contact set comprising at least one first electrically conductive contact pad in electrical contact with said first layer-shaped electrode, and at least one second electrically conductive contact pad in electrical contact with said third layer-shaped electrode; and a second electrically conductive track arranged above the substrate top face and connecting electrically said first and second electrically conductive contact pads of the second contact set to each other, and wherein the respective second electrically conductive tracks of the capacitor 3D-cells are connected to one another.

17. The 3D-capacitor structure according to claim 16, wherein the interconnected second electrically conductive tracks of the capacitor 3D-cells form a second periodic 2D-network above the tiling formed by the capacitor 3D-cells.

18. The 3D-capacitor structure according to claim 16, wherein at least some of the electrically conductive contact pads which contact a same one among the second and the third layer-shaped electrodes but belong to neighboring capacitor 3D-cells within the tiling, are common to said neighboring capacitor 3D-cells.

19. The 3D-capacitor structure according to claim 14, wherein in each capacitor 3D-cell the trench has a design such as to form several pillars separated from each other and separated from sidewalls of the trench, and each pillar having side-surfaces extending perpendicular to the substrate top face and to a bottom of the trench, and wherein each one of the first layer-shaped electrode and the first and second dielectric-electrode (DE) structures cover the side-surfaces of the pillars and each capacitor 3D-cell includes a second contact set arranged above the substrate top face for contacting at least the third layer-shaped electrode, said second contact set comprising at least one electrically conductive contact pad which is in electrical contact with said third layer-shaped electrode, and which is located at least partially above one of the pillars, along a direction perpendicular to the substrate top face.

20. An electronic device, comprising at least one 3D-capacitor structure including several capacitor 3D-cells formed on one same silicon substrate, all capacitor 3D-cells being each in accordance with claim 1, and arranged close to another on the substrate top face so as to form a tiling within at least one portion of said substrate top face, wherein the first layer-shaped electrode and each one of the dielectric-electrode (DE) structures extend from any one of the capacitor 3D-cells to any other one of the capacitor 3D-cells, and wherein the respective first electrically conductive tracks of the capacitor 3D-cells are connected to one another.

21. The electronic device of claim 20, forming a cellular phone, a tablet or a laptop computer.

* * * * *